United States Patent
Tanaka et al.

(10) Patent No.: US 11,887,818 B2
(45) Date of Patent: Jan. 30, 2024

(54) METHODS AND SYSTEMS TO MODULATE FILM STRESS

(71) Applicant: Applied Materials, Inc., Santa Clara, CA (US)

(72) Inventors: Tsutomu Tanaka, Santa Clara, CA (US); John C. Forster, Mt. View, CA (US); Ran Liu, Sunnyvale, CA (US); Kenichi Ohno, Sunnyvale, CA (US); Ning Li, San Jose, CA (US); Mihaela Balseanu, Sunnyvale, CA (US); Keiichi Tanaka, San Jose, CA (US); Li-Qun Xia, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 165 days.

(21) Appl. No.: 17/498,231

(22) Filed: Oct. 11, 2021

(65) Prior Publication Data
US 2022/0028660 A1    Jan. 27, 2022

Related U.S. Application Data

(62) Division of application No. 15/805,466, filed on Nov. 7, 2017, now Pat. No. 11,158,489.

(60) Provisional application No. 62/419,248, filed on Nov. 8, 2016.

(51) Int. Cl.
| | | |
|---|---|---|
| H01J 37/32 | (2006.01) |
| C23C 16/50 | (2006.01) |
| C23C 16/455 | (2006.01) |
| C23C 16/458 | (2006.01) |
| C23C 16/34 | (2006.01) |
| C23C 16/40 | (2006.01) |
| C23C 16/52 | (2006.01) |
| C23C 16/505 | (2006.01) |

(52) U.S. Cl.
CPC ...... *H01J 37/32449* (2013.01); *C23C 16/345* (2013.01); *C23C 16/401* (2013.01); *C23C 16/458* (2013.01); *C23C 16/4554* (2013.01); *C23C 16/4583* (2013.01); *C23C 16/45544* (2013.01); *C23C 16/45551* (2013.01); *C23C 16/50* (2013.01); *C23C 16/505* (2013.01); *C23C 16/52* (2013.01); *H01J 37/3244* (2013.01); *H01J 37/32137* (2013.01); *H01J 37/32183* (2013.01); *H01J 37/32935* (2013.01); *H01J 37/32082* (2013.01)

(58) Field of Classification Search
CPC ............ H01J 37/32449; C23C 16/345; C23C 16/401; C23C 16/52; C23C 16/50
See application file for complete search history.

(56) References Cited

U.S. PATENT DOCUMENTS

| | | | |
|---|---|---|---|
| 4,264,393 A | 4/1981 | Gorin |
| 4,307,354 A | 12/1981 | Miyagawa |
| 2007/0023398 A1 | 2/2007 | Kobayashi et al. |
| 2010/0029024 A1 | 2/2010 | Miyake et al. |
| 2011/0240222 A1 | 10/2011 | Sawada et al. |

(Continued)

*Primary Examiner* — Mounir S Amer
*Assistant Examiner* — Alexander Belousov
(74) *Attorney, Agent, or Firm* — Servilla Whitney LLC

(57) ABSTRACT

Apparatus and methods to control the phase of power sources for plasma process regions in a batch process chamber. A master exciter controls the phase of the power sources during the process sequence based on feedback from the match circuits of the respective plasma sources.

9 Claims, 6 Drawing Sheets

(56) References Cited

U.S. PATENT DOCUMENTS

| | | | |
|---|---|---|---|
| 2013/0284369 A1* | 10/2013 | Kobayashi | B05C 9/00 |
| | | | 118/712 |
| 2015/0126037 A1 | 5/2015 | Chen | |
| 2015/0194298 A1* | 7/2015 | Lei | H01L 21/02183 |
| | | | 438/782 |

* cited by examiner

METHODS AND SYSTEMS TO MODULATE FILM STRESS

CROSS-REFERENCE TO RELATED APPLICATIONS

This application is a divisional of U.S. patent application Ser. No. 15/805,466, filed Nov. 7, 2017, which claims priority to U.S. Provisional Application No. 62/419,248, filed Nov. 8, 2016, the entire disclosures of which are hereby incorporated by reference herein.

TECHNICAL FIELD

The present disclosure relates generally to apparatus for depositing thin films. In particular, the disclosure relates to apparatus for depositing thin films in a spatial atomic layer deposition batch processing chamber.

BACKGROUND

Films deposited in the preparation of a semiconductor device can have a variety of parameters. For example, density, film stress, wet etch rate, refractive index and growth per cycle. It may be helpful to modulate or change some or all of these parameters depending on the device being formed. One way to change, for example, the density of a film, is to expose the film to plasma. However, plasma exposure can cause damage to a film or device being prepared. Additionally, some film properties (e.g., film stress) are not readily changeable without affecting other film parameters.

Therefore, there is a need in the art for apparatus and methods to change individual film properties.

SUMMARY

One or more embodiments of the disclosure are directed to processing chambers comprising a gas distribution assembly comprising a plurality of reactive gas ports arranged around a central axis. Each of the reactive gas ports is separated from adjacent reactive gas ports by a gas curtain. A first power source is connected to a first plasma gas port and coupled to a first match circuit. A second power source is connected to a second plasma gas port and coupled to a second match circuit. A master exciter is connected to the first power source, the second power source, the first match circuit and the second match circuit. The master exciter is configured to control a phase of one or more of the first power source and the second power source.

Additional embodiments of the disclosure are directed to methods comprising powering a first power source connected to a first plasma gas port in a first process region of a processing chamber. The first power source is coupled to a first match circuit. A second power source connected to a second plasma gas port in a process region different from the first process region of the processing chamber is powered. The second power source is coupled to a second match circuit. A phase of one or more of the first power source or the second power source is controlled using a master exciter connected to the first power source, the second power source, the first match circuit and the second match circuit.

Further embodiments of the disclosure are directed to methods of depositing a SiO or SiN film. A substrate is exposed to a silicon precursor in a first process region of a processing chamber. The substrate is laterally moved through a gas curtain to a second process region of the processing chamber. The substrate is exposed to a first plasma in the second process region of the processing chamber. The first plasma is generated by a first power source coupled to a first match circuit and has a first phase. The substrate is laterally moved through a gas curtain to a third process region of the processing chamber. The substrate is exposed to a silicon precursor in the third process region and laterally moved through a gas curtain to a fourth process region. The substrate is exposed to a second plasma in the fourth process region of the processing chamber. The second plasma is generated by a second power source coupled to a second match circuit. The second power source has a second phase. One or more of the first phase and the second phase is controlled to maintain a phase difference in the range of about 170° to about 190°.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Figure 1:
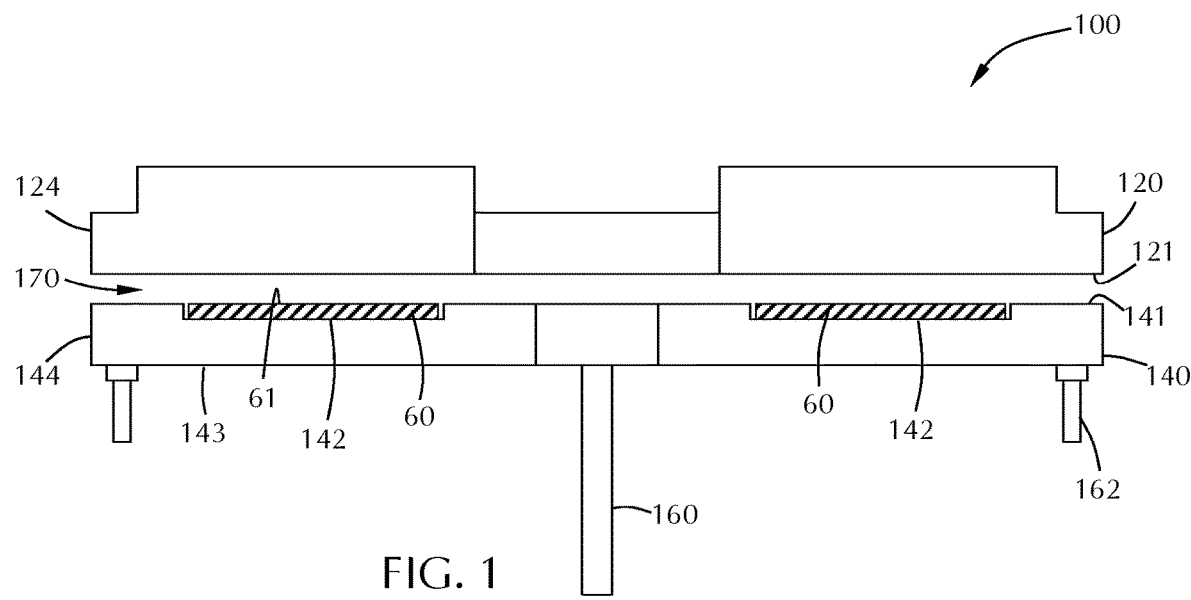
FIG. 1 shows a cross-sectional view of a batch processing chamber in accordance with one or more embodiment of the disclosure.

Before describing several exemplary embodiments of the disclosure, it is to be understood that the disclosure is not limited to the details of construction or process steps set forth in the following description. The disclosure is capable of other embodiments and of being practiced or being carried out in various ways.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present disclosure, any of the film processing steps disclosed may also be performed on an under-layer formed on the substrate as disclosed in more detail below, and the term "substrate surface" is intended to include such under-layer as the context indicates. Thus for example, where a film/layer or partial film/layer has been deposited onto a substrate surface, the exposed surface of the newly deposited film/layer becomes the substrate surface.

As used in this specification and the appended claims, the terms "precursor", "reactant", "reactive gas" and the like are used interchangeably to refer to any gaseous species that can react with the substrate surface.

Embodiments of the disclosure provide apparatus and methods to modulate film stress of plasma-enhanced atomic layer deposited (PEALD) SiO and SiN without changing process parameters or impacting other film properties. Batch processing architecture can enable the use of multiple (e.g., 2 or 4) RF generators for PEALD deposition. The film stress modulation can be achieved by tuning the phase difference between the RF generators used for the deposition process. The effect can be achieved by changing the way the RF plasma is coupled in different process regions of the processing chamber is coupled into the system.

Some embodiments are directed to systems developed to enable phase dependent plasma coupling when plasma is turned on in two or more process regions. In some embodiments, each process region has a plasma driven by a different RF generator. The inventors have surprisingly found that the phase shift induces a continuous change in the stress level without impact on the wet etch rate of the film. This is contrary to what would be expected if the stress tuning was achieved by modulating process parameters such as power or pressure.

In some embodiments, the apparatus has the ability to modulate the charge that the wafer is subjected to on the susceptor. This enables film deposition without plasma damage issues that can be caused by excessive charge build-up.

Some embodiments of the disclosure are directed to processes of depositing a spacer material using a batch processing chamber, also referred to as a spatial processing chamber. FIG. 1 shows a cross-section of a processing chamber 100 including a gas distribution assembly 120, also referred to as injectors or an injector assembly, and a susceptor assembly 140. The gas distribution assembly 120 is any type of gas delivery device used in a processing chamber. The gas distribution assembly 120 includes a front surface 121 which faces the susceptor assembly 140. The front surface 121 can have any number or variety of openings to deliver a flow of gases toward the susceptor assembly 140. The gas distribution assembly 120 also includes an outer edge 124 which in the embodiments shown, is substantially round.

The specific type of gas distribution assembly 120 used can vary depending on the particular process being used. Embodiments of the disclosure can be used with any type of processing system where the gap between the susceptor and the gas distribution assembly is controlled. While various types of gas distribution assemblies can be employed (e.g., showerheads), embodiments of the disclosure may be particularly useful with spatial gas distribution assemblies which have a plurality of substantially parallel gas channels. As used in this specification and the appended claims, the term "substantially parallel" means that the elongate axis of the gas channels extend in the same general direction. There can be slight imperfections in the parallelism of the gas channels. In a binary reaction, the plurality of substantially parallel gas channels can include at least one first reactive gas A channel, at least one second reactive gas B channel, at least one purge gas P channel and/or at least one vacuum V channel. The gases flowing from the first reactive gas A channel(s), the second reactive gas B channel(s) and the purge gas P channel(s) are directed toward the top surface of the wafer. Some of the gas flow moves horizontally across the surface of the wafer and out of the process region through the purge gas P channel(s). A substrate moving from one end of the gas distribution assembly to the other end will be exposed to each of the process gases in turn, forming a layer on the substrate surface.

Figure 2:
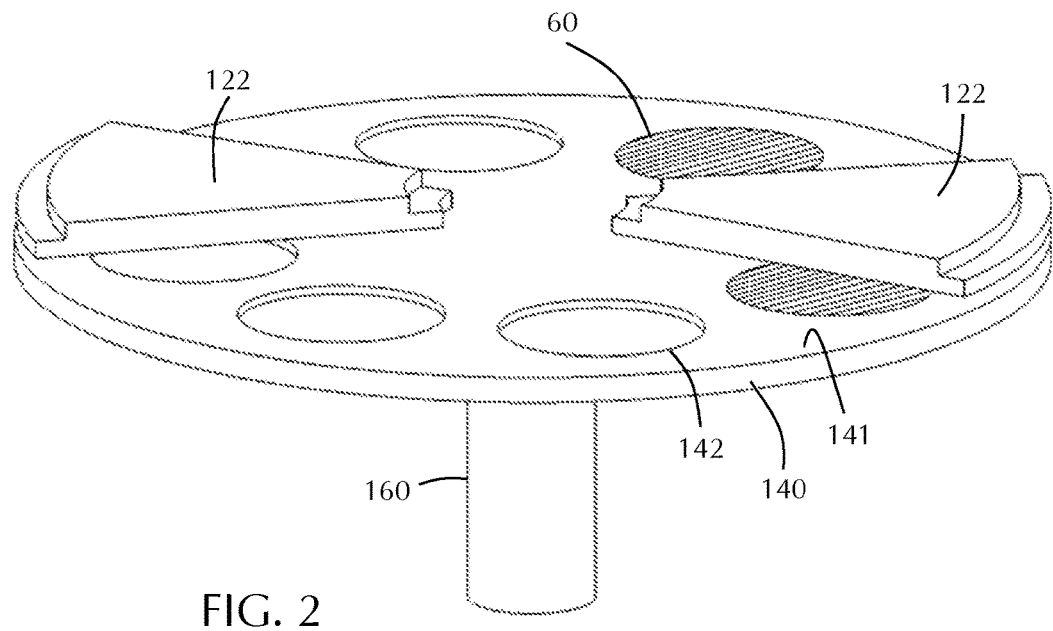
FIG. 2 shows a partial perspective view of a batch processing chamber in accordance with one or more embodiment of the disclosure.

In some embodiments, the gas distribution assembly 120 is a rigid stationary body made of a single injector unit. In one or more embodiments, the gas distribution assembly 120 is made up of a plurality of individual sectors (e.g., injector units 122), as shown in FIG. 2. Either a single piece body or a multi-sector body can be used with the various embodiments of the disclosure described.

A susceptor assembly 140 is positioned beneath the gas distribution assembly 120. The susceptor assembly 140 includes a top surface 141 and at least one recess 142 in the top surface 141. The susceptor assembly 140 also has a bottom surface 143 and an edge 144. The recess 142 can be any suitable shape and size depending on the shape and size of the substrates 60 being processed. In the embodiment shown in FIG. 1, the recess 142 has a flat bottom to support the bottom of the wafer; however, the bottom of the recess can vary. In some embodiments, the recess has step regions around the outer peripheral edge of the recess which are sized to support the outer peripheral edge of the wafer. The amount of the outer peripheral edge of the wafer that is supported by the steps can vary depending on, for example, the thickness of the wafer and the presence of features already present on the back side of the wafer.

In some embodiments, as shown in FIG. 1, the recess 142 in the top surface 141 of the susceptor assembly 140 is sized so that a substrate 60 supported in the recess 142 has a top surface 61 substantially coplanar with the top surface 141 of the susceptor 140. As used in this specification and the appended claims, the term "substantially coplanar" means that the top surface of the wafer and the top surface of the susceptor assembly are coplanar within ±0.2 mm. In some embodiments, the top surfaces are coplanar within 0.5 mm, ±0.4 mm, ±0.35 mm, ±0.30 mm, ±0.25 mm, ±0.20 mm, ±0.15 mm, ±0.10 mm or ±0.05 mm.

The susceptor assembly 140 of FIG. 1 includes a support post 160 which is capable of lifting, lowering and rotating the susceptor assembly 140. The susceptor assembly may include a heater, or gas lines, or electrical components within the center of the support post 160. The support post 160 may be the primary means of increasing or decreasing the gap between the susceptor assembly 140 and the gas distribution assembly 120, moving the susceptor assembly 140 into proper position. The susceptor assembly 140 may also include fine tuning actuators 162 which can make micro-adjustments to susceptor assembly 140 to create a predetermined gap 170 between the susceptor assembly 140 and the gas distribution assembly 120.

In some embodiments, the gap 170 distance is in the range of about 0.1 mm to about 5.0 mm, or in the range of about 0.1 mm to about 3.0 mm, or in the range of about 0.1 mm to about 2.0 mm, or in the range of about 0.2 mm to about 1.8 mm, or in the range of about 0.3 mm to about 1.7 mm, or in the range of about 0.4 mm to about 1.6 mm, or in the range of about 0.5 mm to about 1.5 mm, or in the range of about 0.6 mm to about 1.4 mm, or in the range of about 0.7 mm to about 1.3 mm, or in the range of about 0.8 mm to about 1.2 mm, or in the range of about 0.9 mm to about 1.1 mm, or about 1 mm.

The processing chamber 100 shown in the Figures is a carousel-type chamber in which the susceptor assembly 140 can hold a plurality of substrates 60. As shown in FIG. 2, the gas distribution assembly 120 may include a plurality of separate injector units 122, each injector unit 122 being capable of depositing a film on the wafer, as the wafer is moved beneath the injector unit. Two pie-shaped injector units 122 are shown positioned on approximately opposite sides of and above the susceptor assembly 140. This number of injector units 122 is shown for illustrative purposes only. It will be understood that more or less injector units 122 can be included. In some embodiments, there are a sufficient number of pie-shaped injector units 122 to form a shape conforming to the shape of the susceptor assembly 140. In some embodiments, each of the individual pie-shaped injector units 122 may be independently moved, removed and/or replaced without affecting any of the other injector units 122. For example, one segment may be raised to permit a robot to access the region between the susceptor assembly 140 and gas distribution assembly 120 to load/unload substrates 60.

Figure 3:
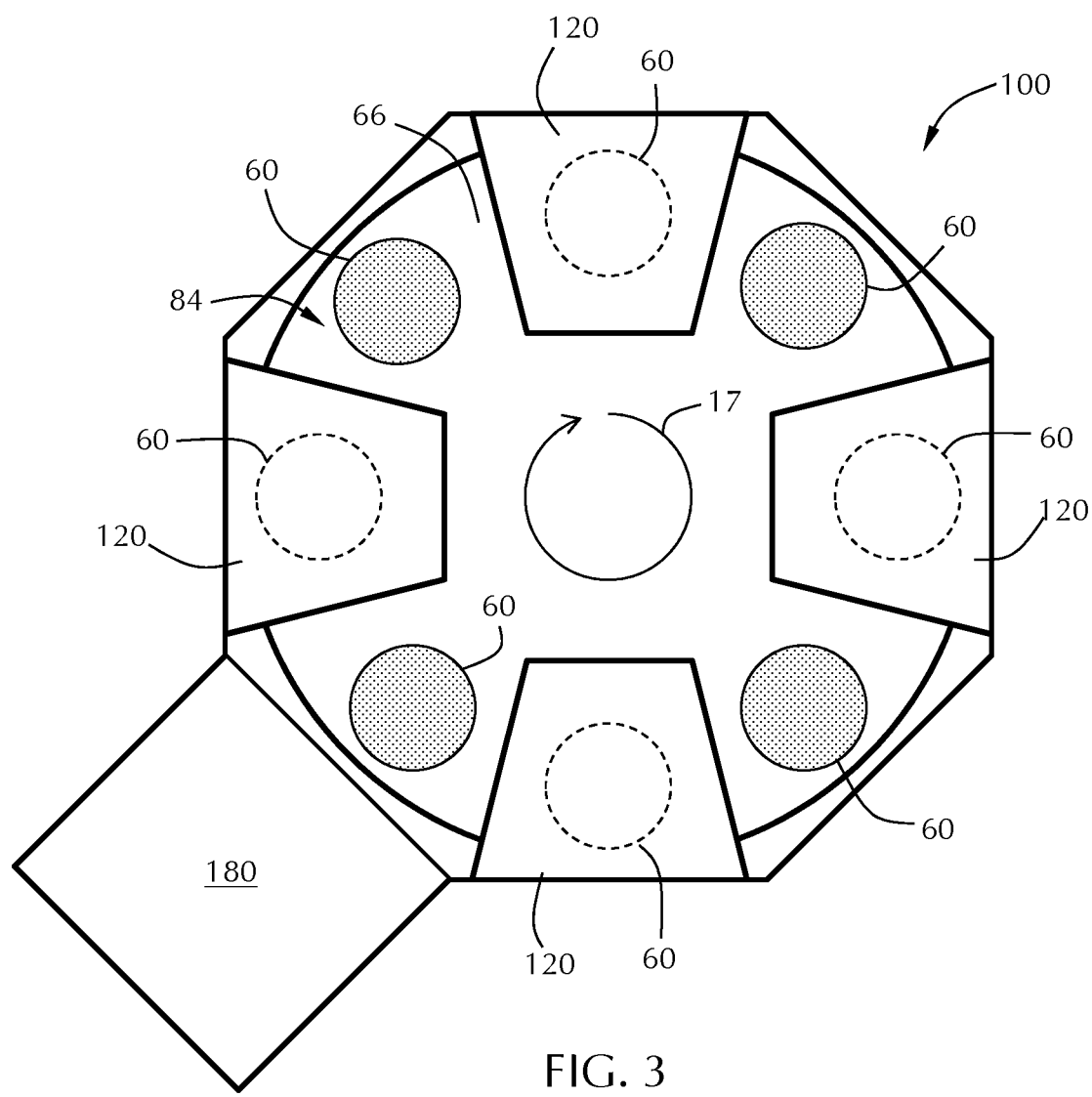
FIG. 3 shows a schematic view of a batch processing chamber in accordance with one or more embodiment of the disclosure.

Processing chambers having multiple gas injectors can be used to process multiple wafers simultaneously so that the wafers experience the same process flow. For example, as shown in FIG. 3, the processing chamber 100 has four gas injector assemblies and four substrates 60. At the outset of processing, the substrates 60 can be positioned between the injector assemblies 30. Rotating 17 the susceptor assembly 140 by 45° will result in each substrate 60 which is between gas distribution assemblies 120 to be moved to an gas distribution assembly 120 for film deposition, as illustrated by the dotted circle under the gas distribution assemblies 120. An additional 45° rotation would move the substrates 60 away from the injector assemblies 30. The number of substrates 60 and gas distribution assemblies 120 can be the same or different. In some embodiments, there are the same numbers of wafers being processed as there are gas distribution assemblies. In one or more embodiments, the number of wafers being processed are fraction of or an integer multiple of the number of gas distribution assemblies. For example, if there are four gas distribution assemblies, there are 4x wafers being processed, where x is an integer value greater than or equal to one. In an exemplary embodiment, the gas distribution assembly 120 includes eight process regions separated by gas curtains and the susceptor assembly 140 can hold six wafers.

The processing chamber 100 shown in FIG. 3 is merely representative of one possible configuration and should not be taken as limiting the scope of the disclosure. Here, the processing chamber 100 includes a plurality of gas distribution assemblies 120. In the embodiment shown, there are four gas distribution assemblies (also called injector assemblies 30) evenly spaced about the processing chamber 100. The processing chamber 100 shown is octagonal; however, those skilled in the art will understand that this is one possible shape and should not be taken as limiting the scope of the disclosure. The gas distribution assemblies 120 shown are trapezoidal, but can be a single circular component or made up of a plurality of pie-shaped segments, like that shown in FIG. 2.

The embodiment shown in FIG. 3 includes a load lock chamber 180, or an auxiliary chamber like a buffer station. This chamber 180 is connected to a side of the processing chamber 100 to allow, for example the substrates (also referred to as substrates 60) to be loaded/unloaded from the chamber 100. A wafer robot may be positioned in the chamber 180 to move the substrate onto the susceptor.

Rotation of the carousel (e.g., the susceptor assembly 140) can be continuous or intermittent (discontinuous). In continuous processing, the wafers are constantly rotating so that they are exposed to each of the injectors in turn. In discontinuous processing, the wafers can be moved to the injector region and stopped, and then to the region 84 between the injectors and stopped. For example, the carousel can rotate so that the wafers move from an inter-injector region across the injector (or stop adjacent the injector) and on to the next inter-injector region where the carousel can pause again. Pausing between the injectors may provide time for additional processing steps between each layer deposition (e.g., exposure to plasma).

Figure 4:
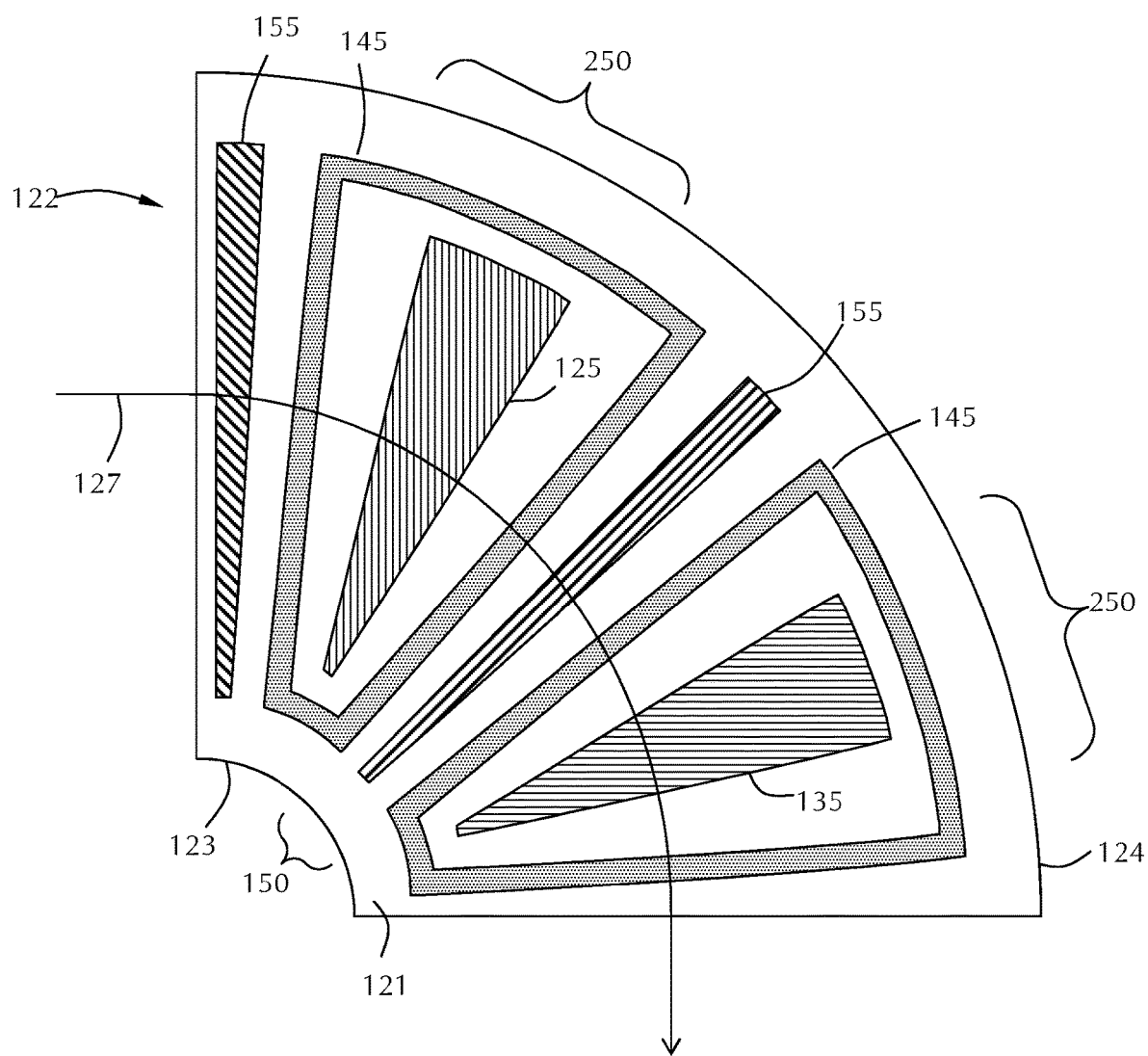
FIG. 4 shows a schematic view of a portion of a wedge shaped gas distribution assembly for use in a batch processing chamber in accordance with one or more embodiment of the disclosure.
Figure 5:
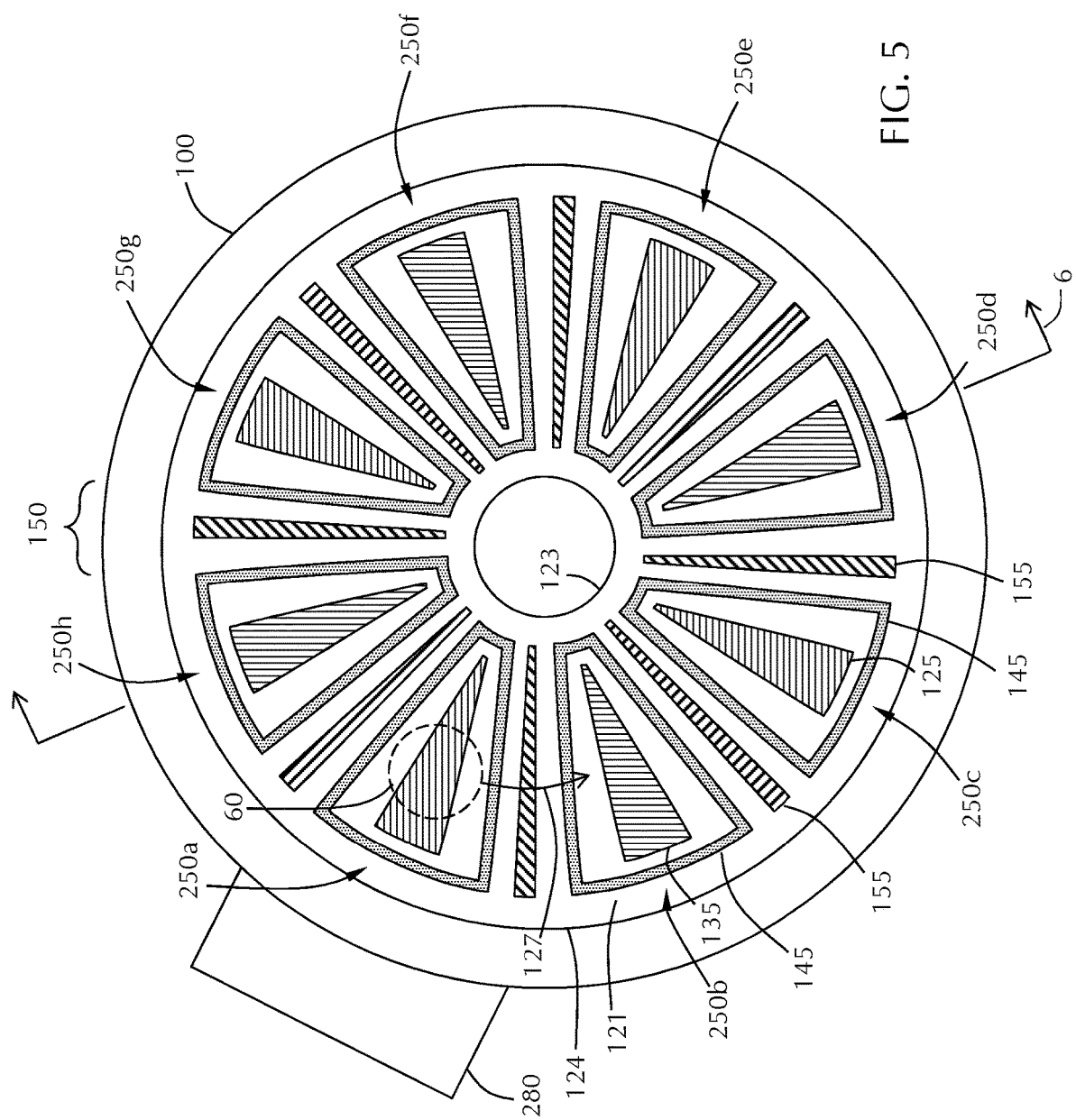
FIG. 5 shows a schematic view of a batch processing chamber in accordance with one or more embodiment of the disclosure.

FIG. 4 shows a sector or portion of a gas distribution assembly 220, which may be referred to as an injector unit 122. The injector units 122 can be used individually or in combination with other injector units. For example, as shown in FIG. 5, four of the injector units 122 of FIG. 4 are combined to form a single gas distribution assembly 220. (The lines separating the four injector units are not shown for clarity.) While the injector unit 122 of FIG. 4 has both a first reactive gas port 125 and a second gas port 135 in addition to purge gas ports 155 and vacuum ports 145, an injector unit 122 does not need all of these components.

Referring to both FIGS. 4 and 5, a gas distribution assembly 220 in accordance with one or more embodiment may comprise a plurality of sectors (or injector units 122) with each sector being identical or different. The gas distribution assembly 220 is positioned within the processing chamber and comprises a plurality of elongate gas ports 125, 135, 145 in a front surface 121 of the gas distribution assembly 220. The plurality of elongate gas ports 125, 135, 145, 155 extend from an area adjacent the inner peripheral edge 123 toward an area adjacent the outer peripheral edge 124 of the gas distribution assembly 220. The plurality of gas ports shown include a first reactive gas port 125, a second gas port 135, a vacuum port 145 which surrounds each of the first reactive gas ports and the second reactive gas ports and a purge gas port 155.

With reference to the embodiments shown in FIG. 4 or 5, when stating that the ports extend from at least about an inner peripheral region to at least about an outer peripheral region, however, the ports can extend more than just radially from inner to outer regions. The ports can extend tangentially as vacuum port 145 surrounds reactive gas port 125 and reactive gas port 135. In the embodiment shown in FIGS. 4 and 5, the wedge shaped reactive gas ports 125, 135 are surrounded on all edges, including adjacent the inner peripheral region and outer peripheral region, by a vacuum port 145.

Referring to FIG. 4, as a substrate moves along path 127, each portion of the substrate surface is exposed to the various reactive gases. To follow the path 127, the substrate will be exposed to, or "see", a purge gas port 155, a vacuum port 145, a first reactive gas port 125, a vacuum port 145, a purge gas port 155, a vacuum port 145, a second gas port 135 and a vacuum port 145. Thus, at the end of the path 127 shown in FIG. 4, the substrate has been exposed to the first reactive gas 125 and the second reactive gas 135 to form a layer. The injector unit 122 shown makes a quarter circle but could be larger or smaller. The gas distribution assembly 220 shown in FIG. 5 can be considered a combination of four of the injector units 122 of FIG. 4 connected in series.

The injector unit 122 of FIG. 4 shows a gas curtain 150 that separates the reactive gases. The term "gas curtain" is used to describe any combination of gas flows or vacuum that separate reactive gases from mixing. The gas curtain 150 shown in FIG. 4 comprises the portion of the vacuum port 145 next to the first reactive gas port 125, the purge gas port 155 in the middle and a portion of the vacuum port 145 next to the second gas port 135. This combination of gas flow and vacuum can be used to prevent or minimize gas phase reactions of the first reactive gas and the second reactive gas.

Referring to FIG. 5, the combination of gas flows and vacuum from the gas distribution assembly 220 form a separation into a plurality of process regions 250. The process regions are roughly defined around the individual gas ports 125, 135 with the gas curtain 150 between 250. The embodiment shown in FIG. 5 makes up eight separate process regions 250 with eight separate gas curtains 150 between. A processing chamber can have at least two process region. In some embodiments, there are at least three, four, five, six, seven, eight, nine, 10, 11 or 12 process regions.

During processing a substrate may be exposed to more than one process region 250 at any given time. However, the portions that are exposed to the different process regions will have a gas curtain separating the two. For example, if the leading edge of a substrate enters a process region including the second gas port 135, a middle portion of the substrate will be under a gas curtain 150 and the trailing edge of the substrate will be in a process region including the first reactive gas port 125.

A factory interface 280, which can be, for example, a load lock chamber, is shown connected to the processing chamber 100. A substrate 60 is shown superimposed over the gas distribution assembly 220 to provide a frame of reference. The substrate 60 may often sit on a susceptor assembly to be held near the front surface 121 of the gas distribution plate 120. The substrate 60 is loaded via the factory interface 280 into the processing chamber 100 onto a substrate support or susceptor assembly (see FIG. 3). The substrate 60 can be shown positioned within a process region because the substrate is located adjacent the first reactive gas port 125 and between two gas curtains 150a, 150b. Rotating the substrate 60 along path 127 will move the substrate counter-clockwise around the processing chamber 100. Thus, the substrate 60 will be exposed to the first process region 250a through the eighth process region 250h, including all process regions between.

Embodiments of the disclosure are directed to processing methods comprising a processing chamber 100 with a plurality of process regions 250a-250h with each process region separated from an adjacent region by a gas curtain 150. For example, the processing chamber shown in FIG. 5. The number of gas curtains and process regions within the processing chamber can be any suitable number depending on the arrangement of gas flows. The embodiment shown in FIG. 5 has eight gas curtains 150 and eight process regions 250a-250h.

A plurality of substrates 60 are positioned on a substrate support, for example, the susceptor assembly 140 shown FIGS. 1 and 2. The plurality of substrates 60 are rotated around the process regions for processing. Generally, the gas curtains 150 are engaged (gas flowing and vacuum on) throughout processing including periods when no reactive gas is flowing into the chamber.

Accordingly, one or more embodiments of the disclosure are directed to processing methods utilizing a batch processing chamber like that shown in FIG. 5. A substrate 60 is placed into the processing chamber which has a plurality of sections 250, each section separated from adjacent section by a gas curtain 150.

Figure 6:
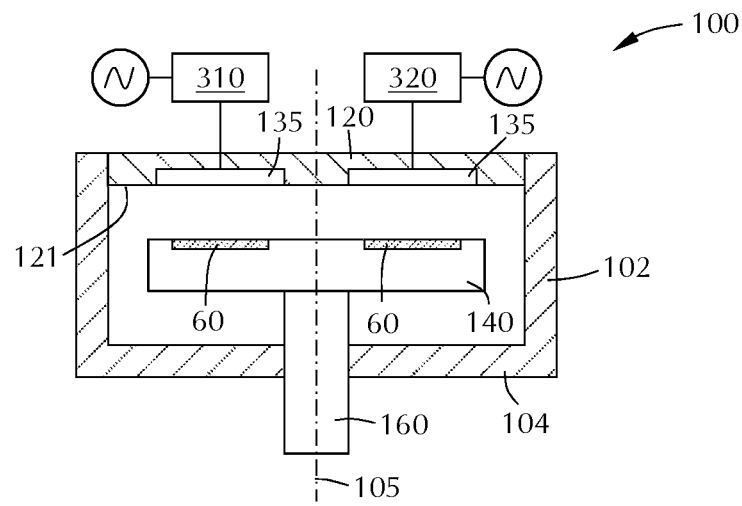
FIG. 6 shows a cross-sectional view of a batch processing chamber in accordance with one or more embodiment of the disclosure.

FIG. 6 shows a cross-sectional view of a processing chamber 100 with sidewalls 102 and a bottom 104 taken along plane 6 shown in FIG. 5. The susceptor assembly 140 on the support post 160 is located within the processing chamber 100. The cross-sectional view passes through the central axis 105 so that two substrates 60 on the susceptor assembly 160. The cross-sectional view also shows two reactive gas ports 135 from the gas distribution assembly 120 on opposite sides of the central axis 105.

In the embodiment shown in FIG. 6, the reactive gas port 135 on the left is powered by a first power source 310 and the reactive gas port 135 on the right is powered by a second power source 320. Each of the first power source 310 and the second power source 320 are operated at a phase, which as shown, are typically about the same. Conventionally, the phases of the power sources are not controlled during processing and can drift. The inventors have found that the phase drift can cause an increase in film stress.

Figure 7:
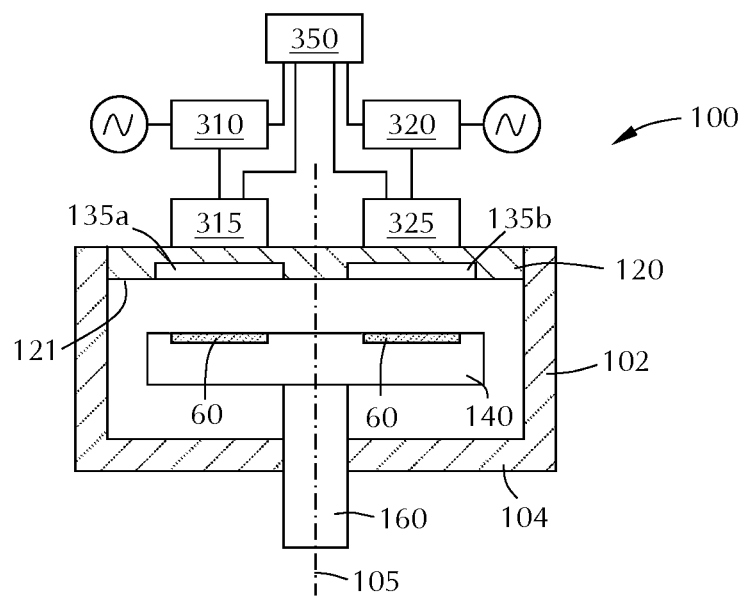
FIG. 7 shows a cross-sectional view of a batch processing chamber in accordance with one or more embodiment of the disclosure.

FIG. 7 shows an embodiment of a processing chamber 100 in accordance with one or more embodiments of the disclosure. The processing chamber 100 includes a gas distribution assembly comprising 120 comprising a plurality of reactive gas ports 135 arranged around a central axis 105. Each of the reactive gas ports 135 are separated from adjacent reactive gas ports (see FIG. 5) by a gas curtain 150.

The embodiment shown in FIG. 7 illustrates a cross-sectional view in which only two reactive gas ports are shown. These reactive gas ports provide a gas for generation of a plasma in the processing region and are referred to as plasma gas ports. The first power source 310 is connected to a first plasma gas port 135a and coupled with a first match circuit 315. The second power source 320 is connected to a second plasma gas port 135b and couple with a second match circuit 325.

A master exciter 350 is connected to each of the first power source 310, the second power source 320, the first match circuit 315 and the second match circuit 325. The master exciter 350 is configured to control the phase of one or more of the first power source 310 and the second power source 320. The master exciter 350 of some embodiments controls the phase of the power sources.

During processing, the phase of a power source can drift do to any number of factors. The master exciter 350 can be used to control the phase of the individual power sources or can provide control over any or all power sources. In some embodiments, the master exciter 350 is configured to control the phases of the first power source 310 and the second power source 320 to keep the phases about 180° apart. For example, if the first power source 310 phase drifts by 1° per minute, the master exciter 350 can change the phase of the second power source 320 so that the phases remain about 180° apart. In some embodiments, the master exciter 350 maintain the phase of the second power source 320 within about 170° to about 190° of the first power source 310. In some embodiments, the master exciter 350 maintains the phase of the second power source 320 within about 175° to about 185° of the first power source 310.

The phase of the first power source 310 and the second power source 320 can be monitored by any suitable method. In some embodiments, the phases are monitored by the master exciter 350 by monitoring the first match circuit 315 and the second match circuit 325. In some embodiments, the phase of the first power source 310 and/or the second power source 320 are adjusted by a feedback circuit that monitors the first match circuit 315 and the second match circuit 325.

The location of the plasma gas ports can be varied depending on the processing conditions and parameters. In some embodiments, the gas distribution assembly 120 comprises eight reactive gas ports arranged around the central axis 105. In one or more embodiments, the first plasma gas port 135a and the second plasma gas port 135b are positioned on opposite sides of the central axis 105.

Figure 8:
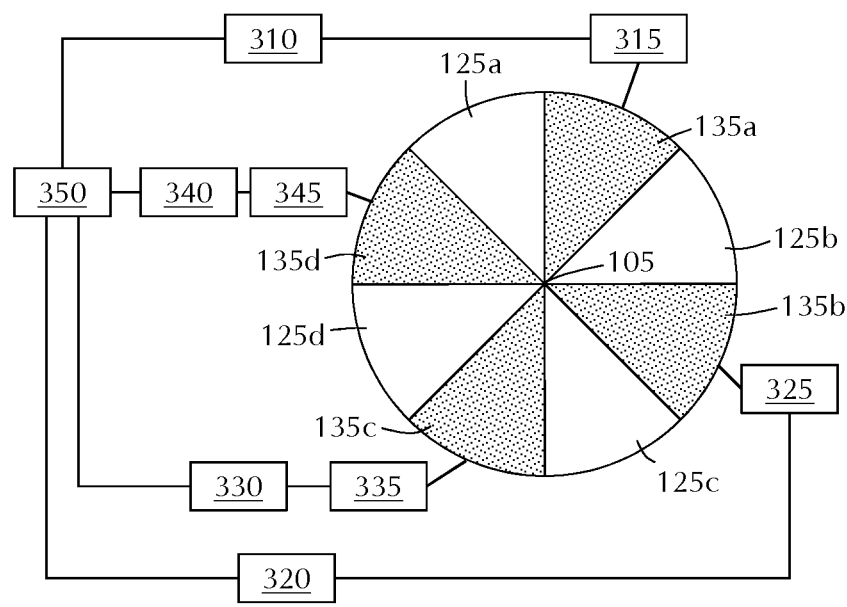
FIG. 8 shows a schematic view of a batch processing chamber in accordance with one or more embodiment of the disclosure.

In some embodiments, there are four plasma gas ports positioned around the central axis 105. FIG. 8 shows an embodiment with a first power source 310 with a first match circuit 315, a second power source 320 with a second match circuit 325, a third power source 330 with a third match circuit 335 and a fourth power source 340 with a fourth match circuit 345. Each of the power sources and match circuits are connected to a different plasma gas port so that there are four independent plasma gas ports 135a, 135b, 135c, 135d arranged around the central axis 105. The master exciter 350 is also connected to each of the power sources and the match circuits and controls the phase of one or more of the power sources.

In some embodiments, the first plasma gas port 135a, the second plasma gas port 135b, the third plasma gas port 135c and the fourth plasma gas port 135d are positioned at increments of about 90° around the central axis 105. In one or more embodiments, there is at least one reactive gas port 125a, 125b, 125c, 125d between each of the plasma gas ports 135a, 135b, 135c, 135d. In some embodiments, each of the reactive gas ports 125a, 125b, 125c, 125d and the plasma gas ports 135a, 135b, 135c, 135d are separated by a gas curtain (see FIG. 5).

In some embodiments, each of the power sources has a phase that is controlled in the range of about 170° to about 190° relative to the phase of the adjacent power sources. For example, the phase of plasma gas port 135a can be maintained about 180° from the phase of the plasma gas port 135d and plasma gas port 135b which are located on either side of the plasma gas port 135a. In some embodiments, the phase of the opposite plasma gas ports, relative to the central axis 105, is about the same while the phases of the alternating gas ports is about 180° different.

In some embodiments, the phases of the gas ports are maintained about 90° apart so that the phase of the fourth plasma gas port 135d is about 90° higher than the phase of the third plasma gas port 135c which is about 90° higher than the phase of the second plasma gas port 135b which is about 90° higher than the phase of the first plasma gas port 135a.

In some embodiments, as shown in FIG. 7, the susceptor assembly 140 positioned a distance from the gas distribution assembly 120. The susceptor assembly 140 is configured to support a plurality of substrates 60 in recesses formed in a top surface of the susceptor assembly 120. The susceptor assembly acts as a ground path for plasma generated by any of the power sources in any of the plasma gas ports.

Some embodiments of the disclosure are directed to methods of processing a substrate or forming a film on a substrate. A first power source 310 connected to a first plasma gas port 135a in a first process region of a processing chamber is powered. The first power source 310 is coupled to a first match circuit. A second power source 320 connected to as second plasma gas port 135b in a second process region that is different from the first process region of a processing chamber is powered. The second power source 320 is coupled to a second match circuit 325. The phase of one or more of the first power source 310 or the second power source 320 is controlled using a master exciter 350 connected to the first power source 310, the second power source 320, the first match circuit 315 and the second match circuit 325.

In some embodiments, the master exciter 350 monitors feedback from the first match circuit 315 and the second match circuit 325 and adjusts the phase of one or more of the first power source 310 and the second power source 320 based on the feedback to maintain the phase of the first power source 310 and the second power source 320 to be within the range of about 170° to about 190° apart.

Some embodiments further comprise powering a third power source 330 connected to a third plasma gas port 135c in a third process region of the processing chamber. The third process region is different from the first process region and the second process region. The third power source 330 is coupled to a third match circuit 335. A fourth power source 340 connected to a fourth plasma gas port 135d in a fourth process region of the process chamber. The fourth process region is different from the first process region, the second process region and the third process region. The fourth power source 340 is coupled to a fourth match circuit 345. The master exciter 350 is connected to and capable of controlling the third power source 330 and/or the fourth power source 340.

Some embodiments of the disclosure are directed to methods of depositing a film. The film of some embodiments comprises silicon oxide, silicon nitride, silicon oxynitride, silicon carbide, silicon carbonitride or silicon oxycarbonitride. The film of some embodiments comprises silicon and one or more of carbon, oxygen or nitrogen atoms.

Referring to FIGS. 5, 7 and 8, the substrate 60 is exposed to a silicon precursor in a first process region 250a of a processing chamber 100. The substrate 60 is laterally moved through a gas curtain 150 to a second process region 250b of the processing chamber 100. The substrate 60 is exposed to a first plasma in the second process region 250b of the processing chamber 100. The first plasma is generated by a first power source 310 with a first phase that is coupled to a first match circuit 315.

The first process region 250a and second process region 250b can be repeated sequentially around the central axis 105 and the substrate 60 can be laterally moved through gas curtains to the different process regions to repeatedly expose the substrate to the silicon precursor and the plasma. For example, the substrate can be laterally moved through a gas curtain to a third process region 250c where the substrate is exposed to the silicon precursor. The substrate can be laterally moved through a gas curtain to a fourth process region 250d where the substrate is exposed to the second plasma generated by a second power source 320 coupled to a second match circuit 325. The second power source 320 has a second phase. The first phase and/or the second phase are controlled to maintain a phase difference in the range of about 170° to about 190°.

Figure 9:
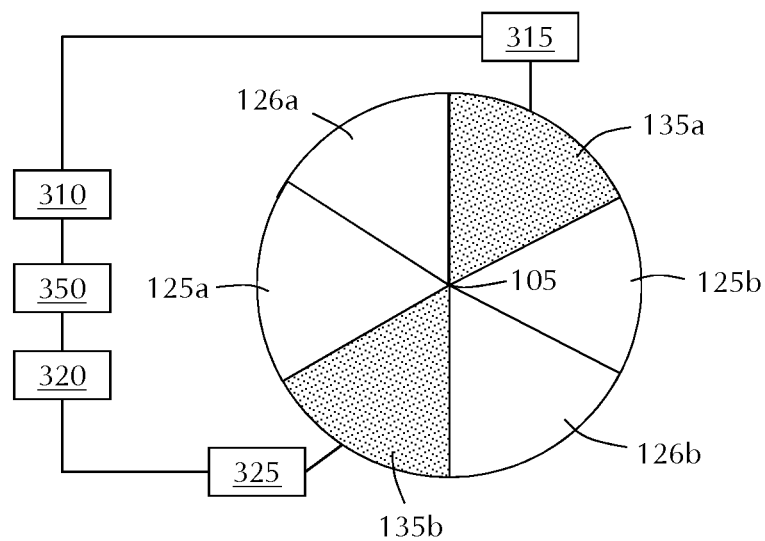
FIG. 9 shows a schematic view of a batch processing chamber in accordance with one or more embodiment of the disclosure.

In some embodiments, as shown in FIG. 9, the processing chamber has two plasma gas ports 135a, 135b located on opposite sides of the central axis 105. The process regions can be separated into any suitable number of regions. For example, as shown, the substrate may be laterally moved from the first process region 125a to a second process region 126a to the first plasma region 135a. This cycle can repeat with the first process region 125b, the second process region 126b and the second plasma region 135b so that the substrate is rotated a complete cycle around the central axis 105.

EXAMPLES

A silicon nitride film was deposited by sequential exposures to a silicon precursor and a nitrogen plasma in a batch processing chamber similar to that depicted in FIG. 5. There were two plasma process regions located on either side of the central axis. The phases of the two plasma process regions were controlled with the master exciter. The stress (MPa) and wet etch rate (Å/min) of the resulting films were measured as a function of the phase shift, as shown in Table 1. The data showed that the film stress decreased as the phase difference between the plasma process regions increased from 0 to 180°. The data also showed that the wet etch rate stayed about the same for these samples. The film stress could be decreased without significantly affecting the wet etch rate of the final films.

TABLE 1

| Phase Shift (deg) | Stress (MPa) | WER (Å/min) |
| --- | --- | --- |
| 0 | 182.02 | 7.997 |
| 30 | 127.95 | 7.791 |
| 60 | 9.72 | 7.442 |
| 90 | −37.46 | 7.209 |
| 120 | −174.48 | 6.835 |
| 150 | −229 | 6.69 |
| 180 | −264 | 7.189 |

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants. According to one or more embodiments, a purge gas is injected at the exit of the deposition chamber to prevent reactants from moving from the deposition chamber to the transfer chamber and/or additional processing chamber. Thus, the flow of inert gas forms a curtain at the exit of the chamber.

The substrate can be processed in single substrate deposition chambers, where a single substrate is loaded, processed and unloaded before another substrate is processed. The substrate can also be processed in a continuous manner, similar to a conveyer system, in which multiple substrate are individually loaded into a first part of the chamber, move through the chamber and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated continuously or in discreet steps. For example, a substrate may be rotated throughout the entire process, or the substrate can be rotated by a small amount between exposures to different reactive or purge gases. Rotating the substrate during processing (either continuously or in steps) may help produce a more uniform deposition or etch by minimizing the effect of, for example, local variability in gas flow geometries.

In atomic layer deposition type chambers, the substrate can be exposed to the first and second precursors either spatially or temporally separated processes. Temporal ALD is a traditional process in which the first precursor flows into the chamber to react with the surface. The first precursor is purged from the chamber before flowing the second precursor. In spatial ALD, both the first and second precursors are simultaneously flowed to the chamber but are separated spatially so that there is a region between the flows that prevents mixing of the precursors. In spatial ALD, the substrate is moved relative to the gas distribution plate, or vice-versa.

In embodiments, where one or more of the parts of the methods takes place in one chamber, the process may be a spatial ALD process. Although one or more of the chemistries described above may not be compatible (i.e., result in reaction other than on the substrate surface and/or deposit on the chamber), spatial separation ensures that the reagents are not exposed to each in the gas phase. For example, temporal ALD involves the purging the deposition chamber. However, in practice it is sometimes not possible to purge the excess reagent out of the chamber before flowing in additional regent. Therefore, any leftover reagent in the chamber may react. With spatial separation, excess reagent does not need to be purged, and cross-contamination is limited. Furthermore, a lot of time can be used to purge a chamber, and therefore throughput can be increased by eliminating the purge step.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method comprising:
powering a first power source connected to a first plasma gas port in a first process region of a processing chamber, the first power source directly coupled to a first match circuit, and the first match circuit directly connected to the first plasma gas port, the first plasma gas port generating a first plasma with a first phase;
powering a second power source connected to a second plasma gas port in a second process region different from the first process region of the processing chamber; the second power source directly coupled to a second match circuit, and the second match circuit directly connected to the second plasma gas port, the second plasma gas port generating a second plasma with a second phase; and
controlling the first phase or the second phase using a master exciter directly connected to the first power source, and the second power source, the first match circuit and the second match circuit.

2. The method of claim 1, wherein the master exciter monitors a feedback from the first match circuit and the second match circuit and adjusts the first phase or the second phase based on the feedback to maintain a phase difference within a range of about 170° to about 190°.

3. The method of claim 1, wherein the first plasma gas port and the second plasma gas port are positioned on opposite sides of a central axis of the processing chamber.

4. The method of claim 1, wherein the master exciter includes a feedback circuit to monitor the first match circuit and the second match circuit and control the first power source and the second power source to adjust the first phase or the second phase.

5. The method of claim 1, further comprising:
powering a third power source connected to a third plasma gas port in a third process region of the processing chamber to generate a third plasma with a third phase, the third process region different from the first process region and the second process region, the third power source directly coupled to a third match circuit; and
powering a fourth power source connected to a fourth plasma gas port in a fourth process region of the processing chamber to generate a fourth plasma with a fourth phase, the fourth process region different from the first process region, the second process region and the third process region, the fourth power source coupled to a fourth match circuit,
wherein the master exciter is also directly connected to the third power source,
and the fourth power source, the master exciter further configured to control one or more of the third phase or the fourth phase.

6. The method of claim 5, wherein the first plasma gas port,
the second plasma gas port, the third plasma gas port and the fourth plasma gas port are positioned at increments of about 90° around a central axis of the processing chamber and each of the power sources is controlled to have a phase in a range of about 170° to about 190° of a phase of adjacent power sources.

7. A method of depositing a SiO or SiN film, the method comprising:
exposing a substrate to a silicon precursor in a first process region of a processing chamber;
laterally moving the substrate through a gas curtain to a second process region of the processing chamber;
exposing the substrate to a first plasma in the second process region of the processing chamber, the first plasma generated by a first plasma port directly coupled to a first match circuit, the first plasma having a first phase;
laterally moving the substrate through a gas curtain to a third process region of the processing chamber;
exposing the substrate to a silicon precursor in the third process region;
laterally moving the substrate through a gas curtain to a fourth process region of the processing chamber;
exposing the substrate to a second plasma in the fourth process region of the processing chamber, the second plasma generated by a second plasma port directly coupled to a second match circuit, the second plasma having a second phase; and
controlling of the first phase or the second phase to maintain a phase difference in a range of about 170° to about 190°.

8. The method of claim 7, wherein a first power source is directly coupled to the first match circuit and a second power source is directly coupled to the second match circuit.

9. The method of claim 8, wherein the controlling of the first phase or the second phase takes place using a master exciter directly connected to the first power source, and the second power source.

* * * * *